(12) United States Patent
Figura

(10) Patent No.: US 11,361,980 B2
(45) Date of Patent: Jun. 14, 2022

(54) DEVICE FOR ALIGNMENT OF TWO SUBSTRATES

(71) Applicant: EV GROUP E. THALLNER GMBH, St. Florian am Inn (AT)

(72) Inventor: Daniel Figura, Piestany (SK)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 65 days.

(21) Appl. No.: 16/459,649

(22) Filed: Jul. 2, 2019

(65) Prior Publication Data
US 2019/0326137 A1  Oct. 24, 2019

Related U.S. Application Data

(63) Continuation of application No. 15/194,652, filed on Jun. 28, 2016, now Pat. No. 10,388,545, which is a continuation of application No. 13/497,602, filed as application No. PCT/EP2010/005243 on Aug. 26, 2010, now Pat. No. 9,576,825.

(30) Foreign Application Priority Data

Sep. 22, 2009  (EP) .................................... 09012023

(51) Int. Cl.
*H01L 21/68* (2006.01)
*H01L 21/67* (2006.01)

(52) U.S. Cl.
CPC .. *H01L 21/67092* (2013.01); *H01L 21/67259* (2013.01); *H01L 21/681* (2013.01)

(58) Field of Classification Search
USPC ......................................... 414/936, 217, 783
See application file for complete search history.

(56) References Cited

U.S. PATENT DOCUMENTS 8,454,771 B2  6/2013  Horikoshi
9,299,620 B2  3/2016  Horikoshi
(Continued)

FOREIGN PATENT DOCUMENTS

EP  1 278 245 A1  1/2003
EP  1 675-165 A2  6/2006
(Continued)

OTHER PUBLICATIONS

International Search Report from corresponding International Patent Application No. PCT/EP2010/005243, dated Dec. 8, 2010.
(Continued)

*Primary Examiner* — Saul Rodriguez
*Assistant Examiner* — Willie Berry, Jr.
(74) *Attorney, Agent, or Firm* — Kusner & Jaffe

(57) ABSTRACT

A device and method for alignment of a first contact surface of a first substrate with a second contact surface of a second substrate which can be held on a second platform includes first X-Y positions of first alignment keys located along the first contact surface, and second X-Y positions of second alignment keys which correspond to the first alignment keys and which are located along the second contact surface. The first contact surface can be aligned based on the first X-Y positions in the first alignment position and the second contact surface can be aligned based on the second X-Y positions in the second alignment position.

10 Claims, 10 Drawing Sheets

(56) References Cited

U.S. PATENT DOCUMENTS

| | | |
|---|---|---|
| 2003/0092244 A1 | 5/2003 | Oi et al. |
| 2007/0020871 A1* | 1/2007 | Chen .................... H01L 21/681 |
| | | 438/401 |
| 2007/0252994 A1 | 11/2007 | Bijnen et al. |
| 2008/0187413 A1 | 8/2008 | Kondoh |
| 2009/0189766 A1 | 7/2009 | Ota et al. |
| 2010/0139836 A1 | 6/2010 | Horikoshi |
| 2013/0244350 A1 | 9/2013 | Horikoshi |

FOREIGN PATENT DOCUMENTS

| | | |
|---|---|---|
| JP | 2005-229006 A | 8/2005 |
| JP | 2008-096605 A | 4/2008 |
| JP | 2009-147257 A | 7/2009 |
| KR | 10-2006-0027697 A | 3/2006 |
| KR | 10-2003-0046846 A | 2/2008 |
| KR | 10-0890380 B1 | 3/2009 |
| KR | 10-2009-0067586 A | 6/2009 |
| WO | WO-2009/022457 A1 | 2/2009 |

OTHER PUBLICATIONS

U.S. Appl. No. 13/497,602, filed Mar. 22, 2012.
U.S. Appl. No. 15/194,652, filed Jun. 28, 2016.

* cited by examiner

DEVICE FOR ALIGNMENT OF TWO SUBSTRATES

RELATED APPLICATIONS

The present application is a continuation of U.S. application Ser. No. 15/194,652, filed Jun. 28, 2016, which is a continuation of U.S. application Ser. No. 13/497,602, now U.S. Pat. No. 9,576,825, filed Mar. 22, 2012, which is a U.S. National Stage Application of International Application No. PCT/EP2010/005243, filed Aug. 26, 2010, which claims priority from European Patent Application No. 09012023.9, filed Sep. 22, 2009, said patent applications hereby fully incorporated herein by reference.

FIELD OF THE INVENTION

The invention relates to a device for alignment of the first contact surface of a first substrate with a second contact surface of a second substrate and a corresponding method.

BACKGROUND OF THE INVENTION

Various procedures are known for mutual arrangement and alignment of the contact surfaces of two substrates, for example wafers, especially nontransparent wafers.

One known procedure is the use of two pairs of microscopes which are each calibrated to a certain viewing point. For purposes of alignment, first the lower wafer is moved to under the upper microscopes and the microscopes are aligned to the lower wafer, the position is fixed and the two alignment keys of the wafers are stored. Then the upper wafer is aligned to the stored alignment keys using the lower microscopes. Then the lower wafer is moved into its original position and the wafers are contacted. With the above described method high precision can be achieved in the positioning. The system however works only based on the detected relative positions of the two alignment keys on both wafers to one another so that calibration of the microscopes to one another and the movement of the wafers in alignment can lead to errors in alignment. Furthermore the number of measurement points on the wafer is limited. The above described method is described in U.S. Pat. No. 6,214,692.

Another approach is to arrange two pairs of microscopes between the wafers to be contacted in order to align the two alignment keys opposite one another, then to move the microscopes out and to finally move the wafers exactly onto one another. In this connection the corresponding errors can occur by the relative motion of the wafers to one another and the relative detection of the alignment keys.

The alignment accuracy of the known alignment technologies is in the region of 0.5 µm, the distribution of the structures which are located on the wafers and which can be aligned to one another, for example chips, and possible deviations of the chips from the given or nominal positions on the wafer not being considered so far. The growing interest in 3D integration reduces the spacing and size of the bore holes so that there is a great demand for more accurate alignment. The deviation from the nominal position of the alignment structures has been ignored to date since the adjustment accuracy which has been possible to date was far more than 10 times these deviations. The deviations are generally less than 100 nm.

One major problem of the existing approaches is the mechanical accuracy of the movements of the components toward one another.

Another problem consists in the optical detection accuracy based on the required working distance of the optics from the wafers. In typical alignment devices (for example U.S. Pat. No. 6,214,692) the working distance must be large enough to be able to move the holding devices for the substrates between the optics. The necessity of this distance limits the maximum usable magnification of these microscopes and thus the maximum attainable detection accuracy for the alignment keys and subsequently the alignment accuracy.

In an arrangement of the optics between the wafers, the orthogonal alignment of the optics to the contact surfaces of the wafer is another aspect which leads to faults in the micron or nanometer range.

SUMMARY OF THE INVENTION

Therefore the object of this invention is to improve a generic device or a generic method such that higher alignment accuracy which relates especially to the entire surface of the wafer is achieved and scrap factors are minimized with respect to the alignment accuracy. In addition, the object of this invention is to increase the throughput in the alignment of wafers.

This object is achieved with the features of the independent claims(s). Advantageous developments of the invention are given in the dependent claims. The framework of the invention also includes all combinations of at least two features given in the specification, the claims and/or the figures. For the indicated value ranges, values which lie within the indicated limits will be disclosed as boundary values and will be able to be claimed in any combination.

The object of the invention is to devise a device and a method in which the X-Y positions of the alignment keys of two substrates which are to be aligned can be detected or measured in at least one X-Y coordinate system which is independent of the movement of the substrates so that the alignment keys of the first substrate can be aligned by correlation of the pertinent alignment keys of the second substrate into the corresponding alignment positions. With this device and this method alignment accuracies of <0.25 µm, especially <0.15 µm, preferably <0.1 µm, can be implemented.

In other words: The device makes available means for detecting the movement of the substrates, especially solely in the X and Y direction, which are referenced to at least one fixed, especially stationary reference point and which thus enable exact alignment of the corresponding alignment keys at least in the X and Y direction.

This is enabled especially in that in addition to the detection means for detecting the X-Y positions of the alignment keys there are separate position detection means for detecting the position of the substrates, especially the position of the platforms which hold the substrates fixed. Position detection means can be laser interferometers and/or linear motors for movement of the platforms in the X and Y direction.

The X-Y positions of the alignment keys on the first substrate are transmitted by first detection means to the assigned first X-Y coordinate system and especially at the same time the X-Y positions of the alignment keys on the second substrate are transmitted by second detection means to the assigned second X-Y coordinate system which is identical especially to the first X-Y coordinate system. In this detection position the X-Y position of the first substrate is detected by position detection means for especially indirect detection of the position of the first substrate, and especially at the same time the X-Y position of the second substrate is detected by position detection means for especially indirect detection of the position of the second substrate.

To the extent the movement of one of the substrates is necessary, for example for alignment or positioning, this is effected by inherently known driving means which are more accurate than the attainable alignment accuracy for example by linear motors at least by a factor of 5, especially a factor of 10, preferably a factor of 50. The driving means can at the same time be used as position detection means. Thus the X-Y positions of the substrates are known. The positions of the receiving means and/or platforms which hold the substrates fixed can be even more preferably detected by position detection means which are more accurate at least by a factor of 10, especially a factor of 50, preferably a factor of 100, for example laser interferometers, in order to further minimize errors in positioning.

The position of the respective detection means in relation to or on the respective receiving means or platform is fixed or can be at least accurately measured, especially with accuracy which is higher at least by a factor of 10, especially a factor of 20, preferably a factor of 50 than the alignment accuracy.

It is especially advantageous here that more than two alignment keys can be measured on each substrate since one skilled in the art had not considered the use of more than two alignment marks for lack of improvement of the alignment result by this measure based on the previously required working distance in the detection of the calibration marks. The measurement of at least three alignment keys for the alignment of wafers can be considered an independent inventive idea, especially in a combination of any features of this invention.

Furthermore it is possible by the above described configuration to use the structures, especially chips, which are located on the substrate as alignment keys so that separately applied calibration marks which had previously been necessary for alignment can be omitted. This invention makes it possible based on high detection accuracy and flexibility of choice of the alignment keys to also use existing marks for example from lithography, especially stepper alignment marks which are located on the corners of the exposure fields.

Moreover the device as claimed in the invention and the method as claimed in the invention can be made adaptive or self-teaching by calibration or optimization of the alignment of the next substrate pairing by measurement of the alignment result and comparison with the computed or nominal result. This feature can also be regarded as an independent inventive idea especially in the combination of any features of this invention.

The coordinate origin for the purposes of the invention can be any defined point of the respective coordinate system. Substrates for the purposes of this invention are very thin and relative thereto, large-area substrates, especially wafers.

The contact surface is the surfaces of the substrates to be aligned and contacted, which surfaces correspond to one another, the contact surface not necessarily forming a closed surface, but it also can be formed by the corresponding structures, especially chips or topographies.

In one general embodiment of the invention the device therefore has the following features:
first X-Y positions of first alignment keys located along the first contact surface can be detected by first detection means in the first X-Y plane in a first X-Y coordinate system which is independent of the motion of the first substrate,
second X-Y positions of second alignment keys which correspond to the first alignment keys and which are located along the second contact surface can be detected by second detection means in a second X-Y plane which is parallel to the first X-Y plane in a second X-Y coordinate system which is independent of the motion of the second substrate,
the first contact surface can be aligned based on the first X-Y positions in the first alignment position and the second contact surface can be aligned based on the second X-Y positions in the second alignment position.

The method as claimed in the invention in a general embodiment has the following steps:
arrangement of the first contact surface in the first X-Y plane and the second contact surface in the second X-Y plane which is parallel to the first X-Y plane,
detection of X-Y positions of first alignment keys located along the first contact surface in the first X-Y coordinate system which is independent of the motion of the first substrate by first detection means and detection of X-Y positions of second alignment keys which correspond to the first alignment keys and which are located along the second contact surface in a second X-Y coordinate system independent of the motion of the second substrate by second detection means,
alignment of the first contact surface in the first alignment position determined on the basis of the first X-Y positions and alignment of the second contact surface in the second alignment position which is determined based on the second X-Y positions and which lies opposite the first contact surface.

The X, Y and Z plane or X, Y and Z direction are advantageously each aligned orthogonally to one another in order to facilitate the computation of the X-Y positions in the X-Y coordinate systems. Advantageously they are identical, especially Cartesian coordinate systems, preferably with the same scaling.

In one advantageous configuration of the invention it is provided that first X-Y positions of more than two first alignment keys can be detected and aligned with corresponding second alignment keys. With a plurality of alignment keys the alignment accuracy is further increased, especially when the X-Y positions of each of the respective alignment keys are known in particular and as a result of the known X-Y positions to one another, alignment is possible with a minimum overall deviation of the sum of the especially quadratic deviations of each alignment key or one corresponding alignment position at a time can be computed for each substrate.

By the first and second X-Y plane in the detection of the first and second X-Y positions being identical, especially in addition at least quasi-identical, preferably identical, to the contacting plane of the first and second contact surface during contacting, the fault susceptibility in contacting in the Z direction is minimized or precluded. Identical is defined as a deviation of a maximum of 20 µm, especially 10 µm, preferably 5 µm which also applies to a possible deviation of the parallelism of the contact surfaces to one another and to the respective platforms or the receiving means.

To the extent the first and/or the second X-Y coordinate system are assigned to the base of the device which is made advantageously stationary and/or rigid and/or solid, this enables a reliable process which is independent of ambient influences.

Since the offset of each first alignment key to the corresponding second alignment key can be determined in the X-Y direction, the individual deviation can be considered in contacting. In this way the production scrap is greatly minimized or the yield is greatly increased, by which the production costs are reduced and the production speed is increased.

Another advantage arises in one configuration of the invention from the fact that the first and/or the second detection means during detection and/or alignment and/or contacting can be fixed, especially mechanically, preferably on the base. This is because by precluding motion of the detection means relative to the assigned X-Y coordinate system further error sources are eliminated.

In the device as claimed in the invention it is advantageously provided that the device can be calibrated by test means for checking the alignment of the contacted substrates. The test means enable conclusions regarding the alignment quality and differences for the computed alignment. The device can therefore be made adaptive and can be self-calibrated. Testing can also take place in an external measurement means, the test means within the device yielding the advantage that possible problems can be detected early and the corresponding measures can be taken.

For testing purposes, especially IR transparent test markings which are provided on the substrates and which enable high-precision determination of the deviation of the substrates can be used.

It contributes to further error minimization that the first detection means in one advantageous embodiment of the invention are formed by a single first alignment key detector and/or the second detection means are formed by a single second alignment key detector.

Exact parallel alignment of the contact surfaces to one another is enabled by first and second distance measurement means and actuators which work especially without contact for movement of the substrates transversely to the X-Y planes being provided for parallel alignment of the first and second contact surfaces. Furthermore, providing distance measurement means enables detection of cambers of the substrates.

The alignment of the substrates using the exact position information of the alignment keys allows computation of the individual alignment of the substrate by means of mathematical models which take into account application-specific criteria and/or parameters. Optimization of alignment can take place especially to achieve maximum yield.

Other advantages, features and details of the invention will become apparent from the following description of preferred exemplary embodiments and using the drawings.

BRIEF DESCRIPTION OF THE DRAWINGS

FIG. 10b shows a schematic sectional view according to cutting line A-A from FIG. 10a.

DETAILED DESCRIPTION OF THE INVENTION

Figure 1A:
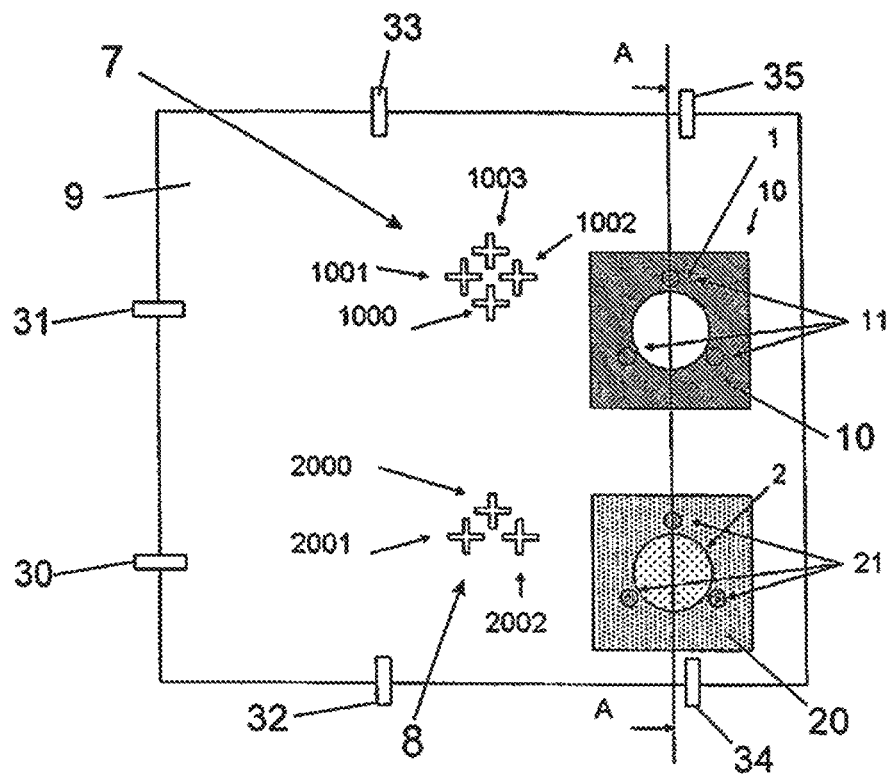
FIG. 1a shows a schematic of a top view of the device as claimed in the invention after loading and rough alignment of the substrates.
Figure 1B:
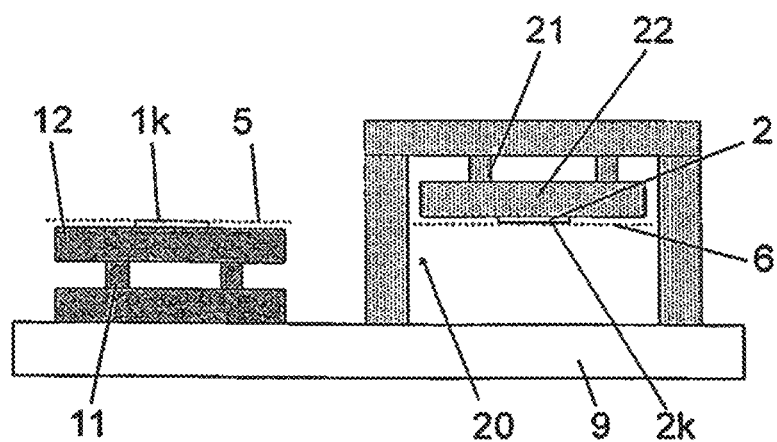
FIG. 1b shows a schematic sectional view according to cutting line A-A from FIG. 1.

FIGS. 1a and 1b show a base 9 on which a first platform 10 and a second platform 20 are movably accommodated, especially by air supporting. The base 9 is advantageously formed from a stationary and/or solid and/or rigid material, especially granite. The movement of the first and second platform 10, 20, especially exclusively in the X and Y direction, can take place by drive means, especially linear motors which are located on the outer contour of the base 9. Each of the first and second platforms 10, 20 is assigned its own drive unit.

The drive unit is connected in a stable, nonflexible manner to the first or second platform 10, 20 assigned to it in order to transmit the drive forces without error and in a high precision manner to the first or second platform 10, 20. The drive units have a maximum deviation of <25 nm, especially <15 nm, preferably <5 nm.

A first substrate 1, especially a wafer, is held and fixed flat, especially by a vacuum, on the first platform 10.

A second substrate 2, especially likewise a wafer, can be held and fixed on the second platform 20.

The two substrates 1, 2 are loaded in a loading step by a loading means which is not shown, especially robot arms, onto the two platforms 10, 20. The first substrate 1 has a first contact surface 1k facing away from the first platform 10 for contacting of a second contact surface 2k of the second substrate 2 facing away from the second platform 20.

The substrates 1, 2 are accommodated respectively on the platforms 10, 20 by suitable receiving means 12, 22, for example chucks. Temporary fixing of the substrates 1, 2 takes place by suitable fixing means, especially by a vacuum. The substrates 1, 2 are thus stationary with reference to the platforms 10, 20.

To move the receiving means 12, 22 in the Z direction, especially also for compensation of a wedge error, three actuators 11 are arranged on the side of the receiving means 12 facing away from the first substrate 1 distributed over the surface of the receiving means 12. This applies analogously to the actuators 21 for movement of the receiving means 22 in the Z-direction, especially for the wedge error compensation step which is described below.

When the substrates 1, 2 are placed on the receiving means 12, 22 rough alignment takes place by first and second microscopes 1001, 2001 so that the substrates 1, 2 are held prepositioned on the receiving means 12, 22 in the X and Y direction or additionally in the direction of rotation.

The first contact surface 1k forms the first X-Y plane 5 and the second contact surface 2k forms the second X-Y plane 6 which in this embodiment roughly coincide at least in the detection of the alignment keys. The maximum deviation of the planes, even with respect to their parallelism, should be less than 20 μm, especially 10 μm, preferably 5 μm. Moreover the first X-Y plane 5 and the second X-Y plane 6, especially with the aforementioned maximum deviations, are each parallel to the bearing surface of the base 9. This minimizes or prevents errors in the movement of the substrates 1, 2 in the Z direction, for example in the contacting of the substrates The first detection means 7 assigned to the first platform 10 comprise the microscope 1001, an alignment key detector 1000, distance measurement means 1002 and a test detector 1003. The test detector 1003 is used for checking and optionally self-calibration of the device as claimed in the invention after contacting of substrates 1 and 2.

Second detection means 8 are assigned to the second platform 20 and comprise an alignment means detector 2000, optical detection means 2001 and distance measurement means 2002 for the second substrate 2.

Position detection means 30, 31, 32, 33, 34, 35, especially laser interferometers, are located and fixed on the periphery or in the region of the outside contour of the base 9 and are intended for exact determination of the position of the first platform 10 and/or of the second platform 20.

The position detection means 30, 31, 32, 33, 34, 35 have a detection accuracy of <25 nm, especially <5 nm, preferably <1 nm, so that possible errors of position detection have more or less no effect on the alignment accuracy, especially since the system can be made self-calibrating.

Figure 2A:
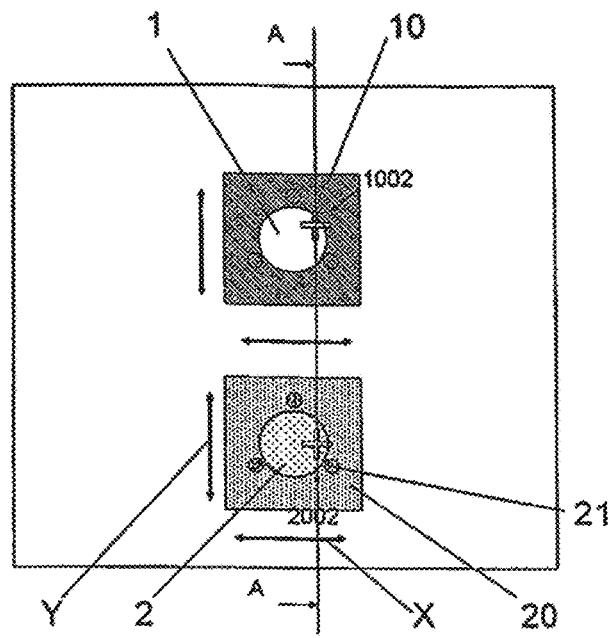
FIG. 2a shows a schematic top view of the device with wedge error compensation.

FIGS. 2a to 2d show the step of wedge error compensation by wedge error compensating means, which step preferably follows the prepositioning of the substrates 1, 2. To detect the vertical position of the first contact surface 1k of the first substrate 1 the first platform 10 as shown in FIG. 2a is moved to under the distance detector 1002 and the distances of several measurement points distributed over the surface of the first substrate (see FIG. 2d) are measured there in order to detect and compensate for a possible wedge error. The process is the same with the second substrate 2 and the corresponding distance detector 2002.

Figure 2B:
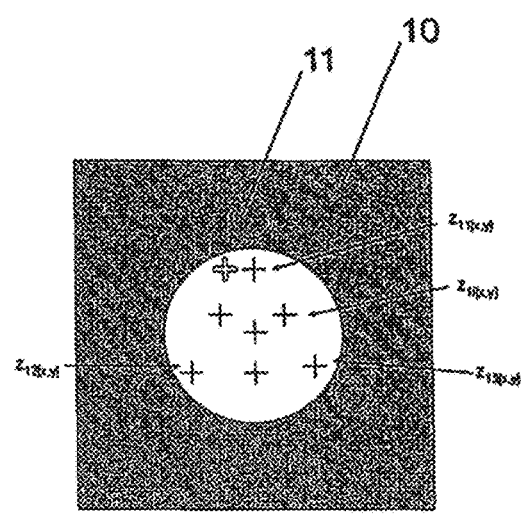
FIG. 2b shows a schematic of a side view according to cutting line A-A from FIG. 2a at the start of the wedge error compensation step.
Figure 2C:
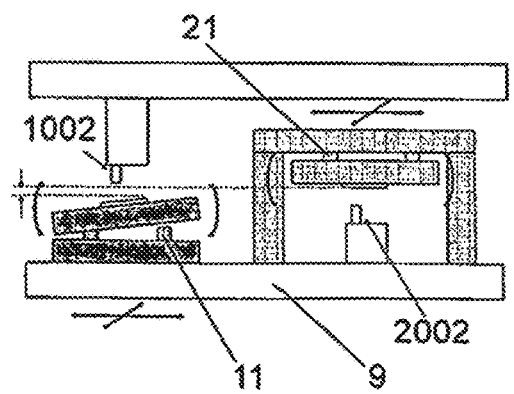
FIG. 2c shows a schematic of a side view according to cutting line A-A from FIG. 2a at the end of the wedge error compensation step.
Figure 2D:
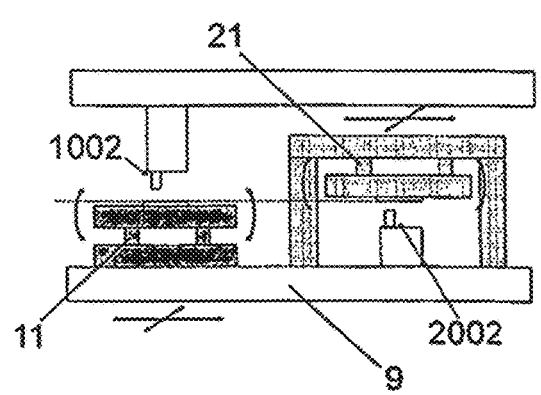
FIG. 2d shows a detailed schematic for the wedge error compensation step.

Then the wedge error is compensated by the corresponding movement of the actuators 11 for the first substrate 1 as shown in FIG. 2b and the actuators 21 for parallel alignment of the second substrate 2 as shown in FIG. 2c. The contact surfaces 1k and 2k are then parallel, likewise the X-Y planes 5 and 6 which preferably form a single plane (see FIG. 2c). The parallelism should have the aforementioned precision.

Figure 3A:
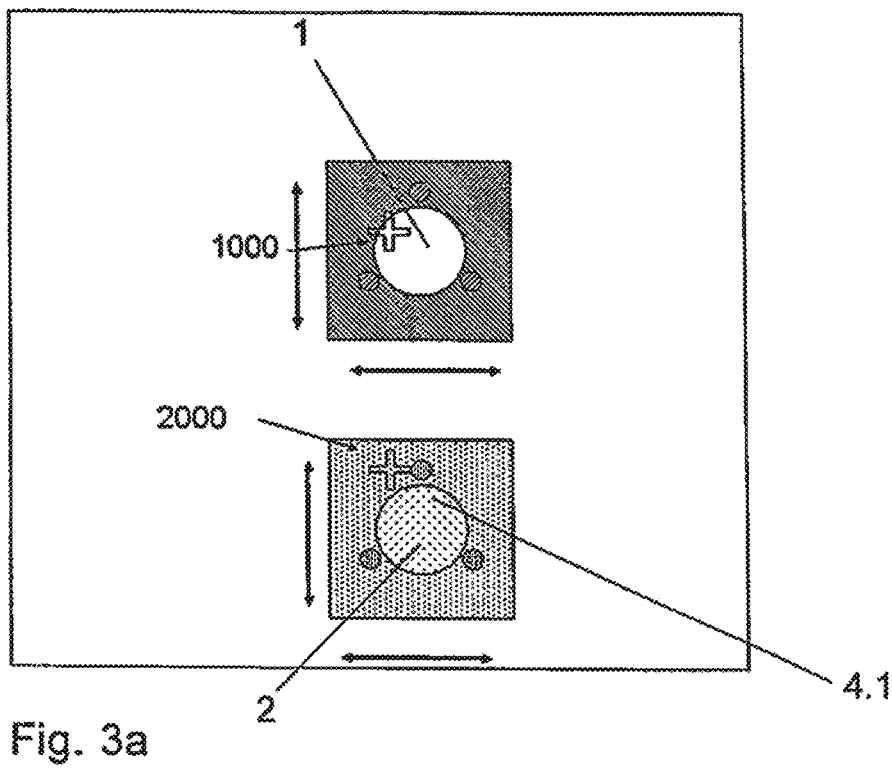
FIG. 3a shows a schematic top view of the device as claimed in the invention in the alignment key detection step.
Figure 3B:
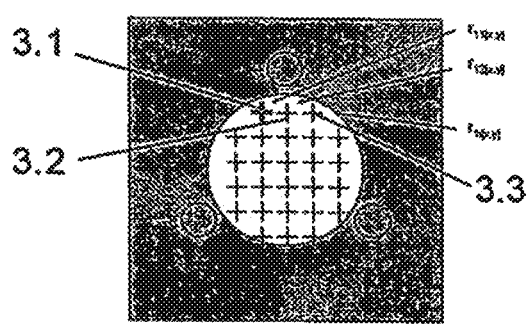
FIG. 3b shows a schematic detailed view for alignment key detection.

In particular, following the wedge error compensation a plurality of first alignment keys 3.1 to 3.n as shown in FIG. 3b are detected by the alignment key detectors 1000, 2000 which are assigned to the first and second platform 10, 20, specifically their X and Y coordinates in a first X-Y coordinate system of the first platform 10 for the first alignment keys 3.1 to 3.n and the second X-Y coordinate system of the second platform 20 for second alignment keys 4.1 to 4.n.

The first X-Y coordinate system is assigned to the first platform 10 and thus to the first substrate 1 which is fixed on it and the second X-Y coordinate system is assigned to the second platform 20 and thus to the second substrate 2 which is fixed on it so that the X-Y positions of the first and second alignment keys 3.1 to 3.n, 4.1 to 4.n can be detected by moving the first and second substrates 1, 2 in the respective X-Y coordinate system, since the X-Y coordinate systems are independent of the motion of the substrates 1, 2. Advantageously the two are a Cartesian coordinate system with identical scaling.

After the step of alignment key detection, accordingly the X-Y positions of the first and second alignment keys 3.1 to 3.n, 4.1 to 4.n which are referenced to the base 9 are known as the absolute position within the device and they no longer change in relation to the platforms 10, 20 during the process.

Figure 4A:
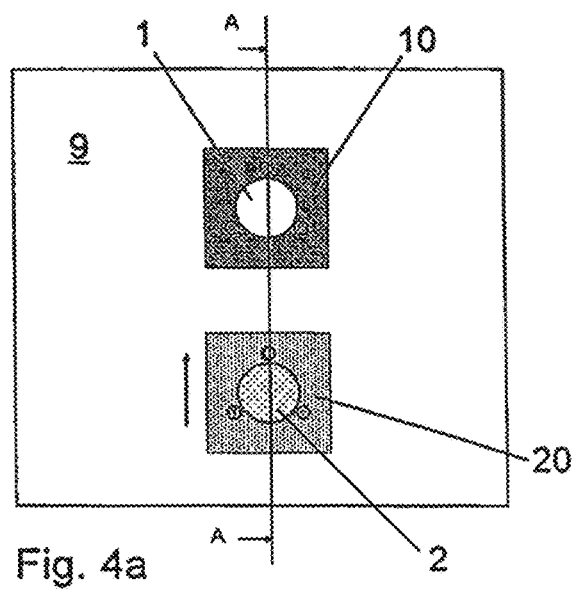
FIG. 4a shows a schematic top view of the device as claimed in the invention in the alignment of the substrates.
Figure 4B:
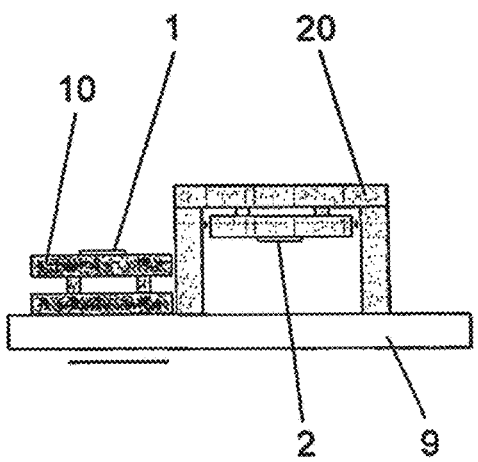
FIG. 4b shows a schematic sectional view according to cutting line A-A from FIG. 4a, FIG. 4c shows a schematic top view of the device as claimed in the invention in the alignment of the substrates.
Figure 4C:
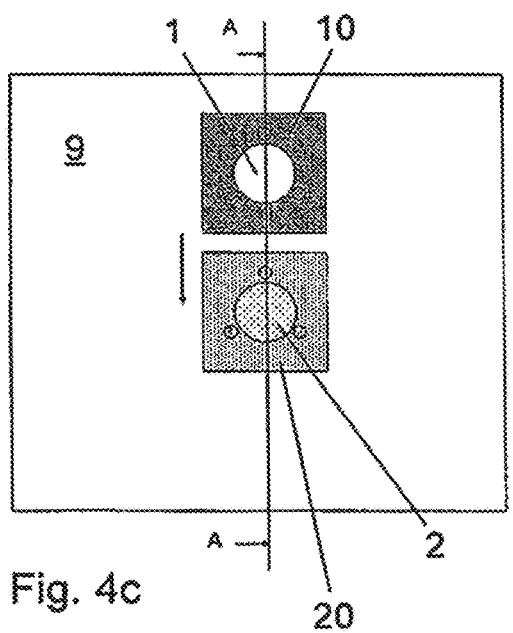
FIG. 4d shows a schematic top view of the device as claimed in the invention after alignment.
FIG. 4e shows a schematic sectional view according to cutting line A-A from FIG. 4d.
Figure 4D:
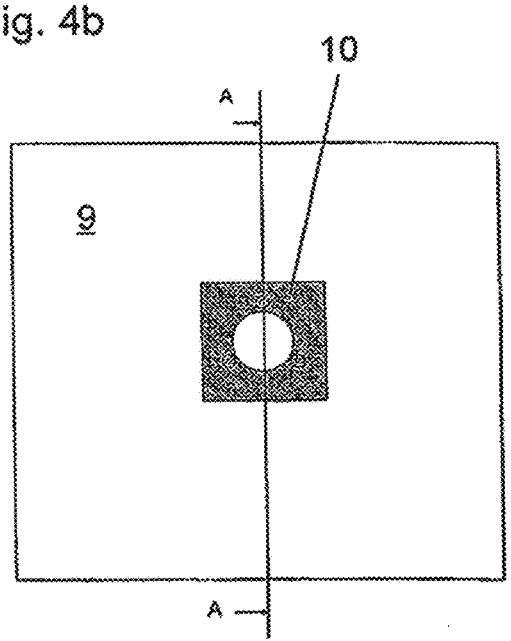
Figure 4E:
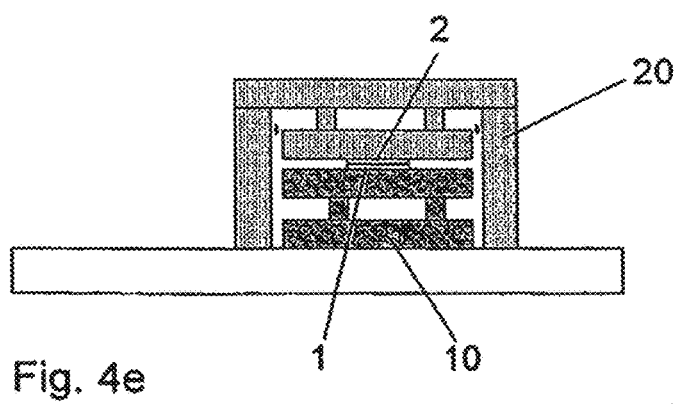
Figure 5A:
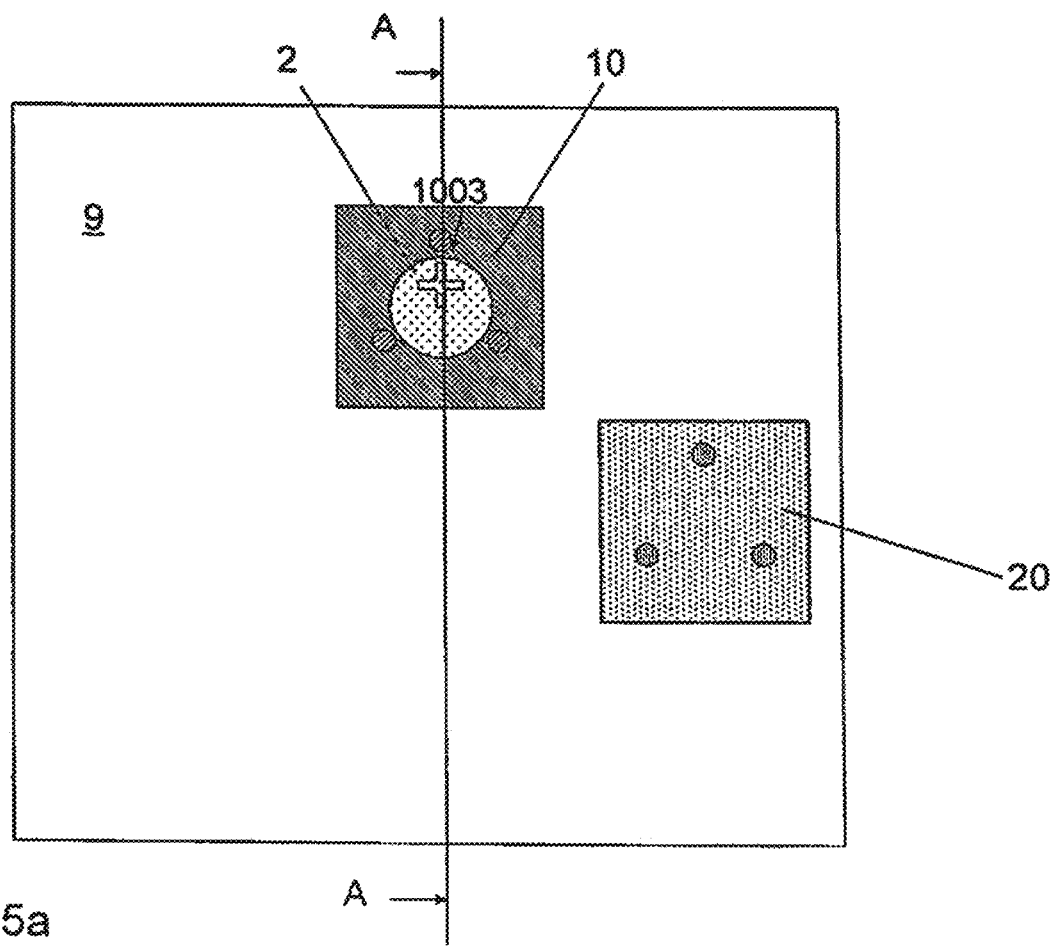
FIG. 5a shows a schematic top view of the device as claimed in the invention in the alignment checking step.
Figure 5B:
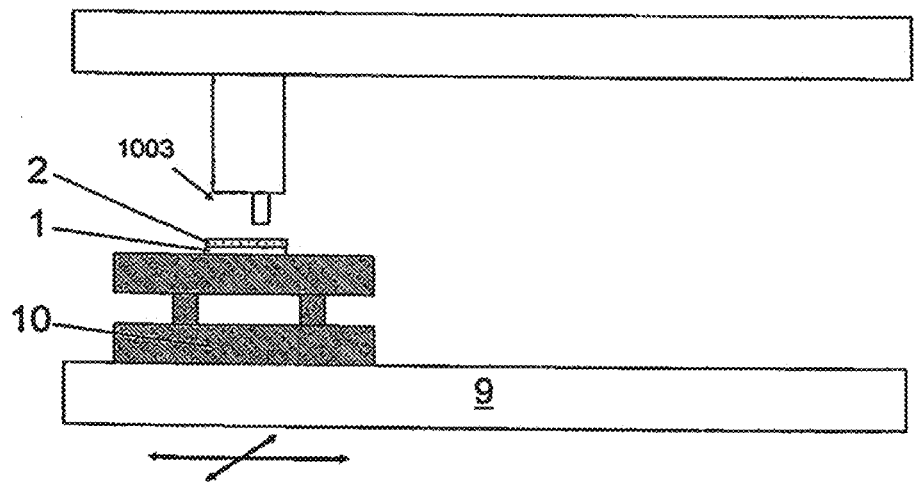
FIG. 5b shows a schematic sectional view according to cutting line A-A from FIG. 5a, FIG. 6a shows a top view of one alternative embodiment of the device as claimed in the invention after loading and rough alignment of the substrates.

FIGS. 4a to 4e show the step of exact alignment which follows detection of the alignment keys 3.1 to 3.n and 4.1 to 4.n and FIG. 4e shows the step of contacting of the two substrates 1, 2. As shown in FIGS. 4a to 4d, the first and second platform 10, 20 are each moved into the respective first and second alignment position which is computed on the basis of the X-Y positions of the first and second alignment keys 3.1 to 3.n, 4.1 to 4.n determined beforehand; this is possible based on the known X-Y positions of the first and second platforms 10, 20.

In the computation of the alignment position, one alignment position at a time with the smallest possible distance of the respectively corresponding first to the respectively corresponding second alignment keys 3.1 to 3.n, 4.1 to 4.n can be computed by mathematical adjustment computation of the alignment keys 3.1 to 3.n and 4.1 to 4.n. For example, the sum of the distances or the sum of the square distances can be minimized or other known mathematical models can be used. In particular, alignment can be done such that a yield becomes possible which is as high as possible depending on the alignment accuracy.

Before the substrates 1, 2 are moved into the position shown in FIG. 4d, movement as small as possible of at least one of the two substrates 1, 2 away from the other in the Z direction is necessary, preferably of the substrate 2, by actuators 21, especially by uniform motion of the actuators 21. Possible errors in the movement of the substrates in the Z direction are compensated since the same motion in the opposite direction is carried out for contacting as shown in FIG. 4c. This is enabled by the detection of the alignment keys 3.1 to 3.n, 4.1 to 4.n as shown in FIGS. 3a and 3b and/or by the step of wedge error compensation as shown in FIGS. 2a to 2d taking place such that the first and second X-Y plane 5, 6 and thus the first and second contact surface 1k, 2k are located in the same plane.

After contacting as shown in FIG. 4e, the substrates 1 and 2 are fixed, for example by known clamping mechanisms or by bonding.

Following the contacting and fixing of the substrates 1, 2, optionally the contacting quality is checked, i.e. the alignment of the substrates 1, 2 to one another by test detectors 1003, preferably in the form of an infrared measurement which checks the relative position of the corresponding test keys or the alignment keys 3.1 to 3.n, 4.1 to 4.n on the first substrate 1 and the second substrate 2. The result is comparable to the alignment computed beforehand and based on the comparison the substrate pair can optionally by qualified as scrap and/or based on the determined information supplied to suitable reworking. Furthermore it is possible to execute the device to be self-teaching by the relation of the first to the second X-Y coordinate system being corrected or calibrated.

Then the contacted and fixed substrate pair of the first substrate 1 and second substrate 2 can be unloaded from the alignment device, especially by loading means which are not shown.

The wedge error compensation means can be made in one alternative embodiment such that a uniformity map of the contact surfaces 1k, 2k of the substrates 1, 2 is computed. At the same time or alternatively thereto, the uniformity, especially flatness, of the contact surfaces 1k, 2k can be influenced by a plurality of actuators 11, 21 by a flexible surface being provided on the receiving means 12, 22.

Another advantage of the device as claimed in the invention consists in that during processing of a substrate pair it is possible to start with the next substrate pair to be processed so that parallel processing is enabled. This greatly increases throughput.

FIGS. 6a to 10b relate to one alternative embodiment in which in contrast to the above described embodiment only one of the two platforms 10', 20', in the specifically shown case the platform 10', is made movable. The advantage of this embodiment lies in the simpler execution, the smaller floor space and the smaller production costs. This is because only three drive motors instead of five are required for movement in the above described embodiment, specifically one drive motor for movement in the X-direction, one for movement in the Y direction and one for rotation. In the above described embodiment, two drive motors are additionally necessary, specifically one for movement of the second platform 20 in the X direction and one for movement of the second platform 20 in the Y direction.

Accordingly only three position detection means 31', 33' and 35' instead of six are required in the above described embodiment.

The progression of the method is similar to the above described embodiment, the movements of the second platform 20 in the alternative embodiment with the rigid second platform 20' being compensated or replaced by the movement of the second detection-means, specifically the alignment key detector 2000' and optical detections means 2001' with the first platform 10'.

To the extent the function of individual components described in FIGS. 6a to 10b is not explicitly described, this is in accordance with the above described embodiment as shown in FIGS. 1a to 5b and vice versa.

Figure 6A:
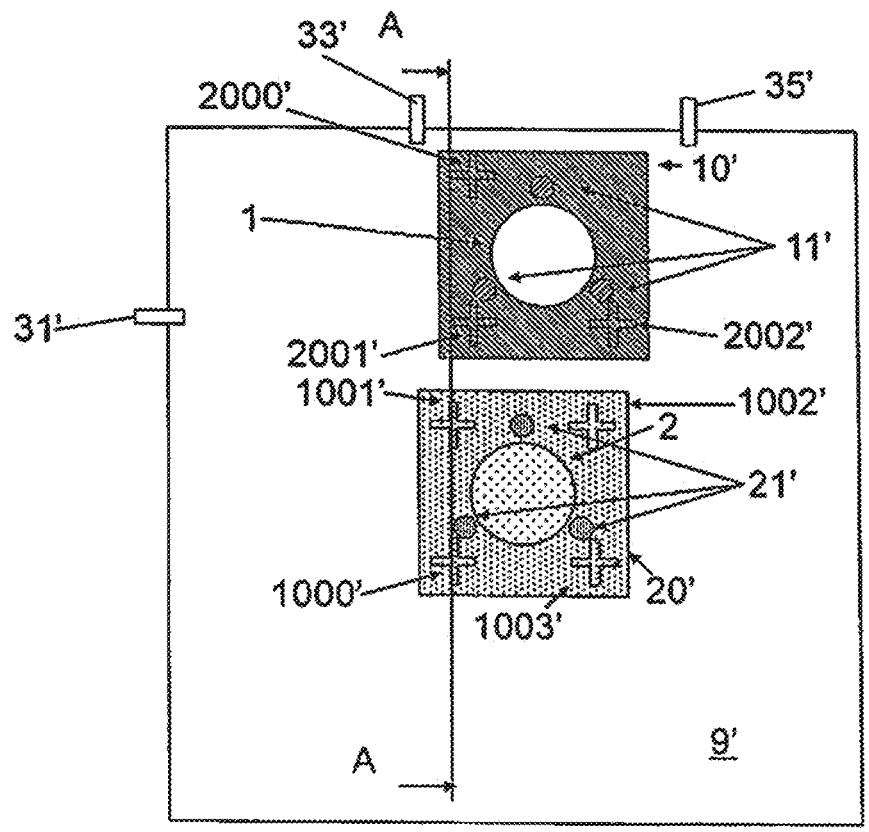
FIG. 6b shows a schematic sectional view according to cutting line A-A from FIG. 6a, FIG. 7a shows a schematic top view of an alternative embodiment in the wedge error compensation step.
Figure 6B:
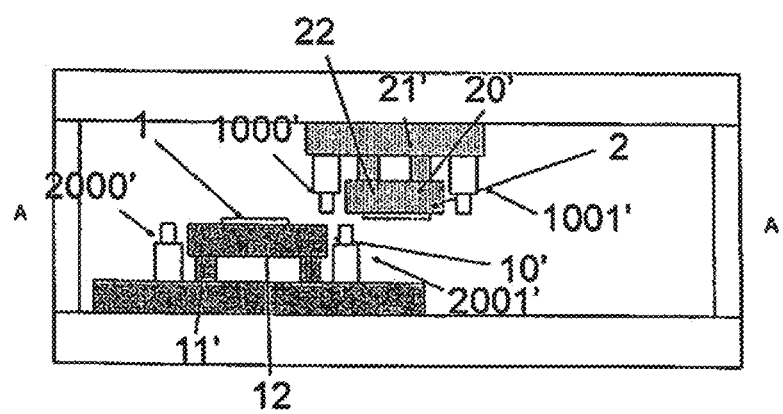

In FIG. 6a the first substrate 1 is held on the first platform 10' and the second substrate 2 is held on the second platform 20', specifically on receiving means 12, 22. The positions of the first and second alignment keys 3.1 to 3.n and 4.1 to 4.n were accordingly roughly pre-aligned by low-resolution optical detection means 1001', 2001'.

While the second detection means, consisting of the alignment means detector 2000', the optical detection means 2001' and a distance measurement means 2002', are arranged fixed on the first platform 10' in a defined position, the first detection means consisting of the alignment key detector 1000', the optical detection means 1001', a distance measurement means 1002' and test detectors 1003' are located on the second platform 20' so that the first and second detection means can each be located opposite the substrate 1, 2 to be measured at the time.

Figure 7A:
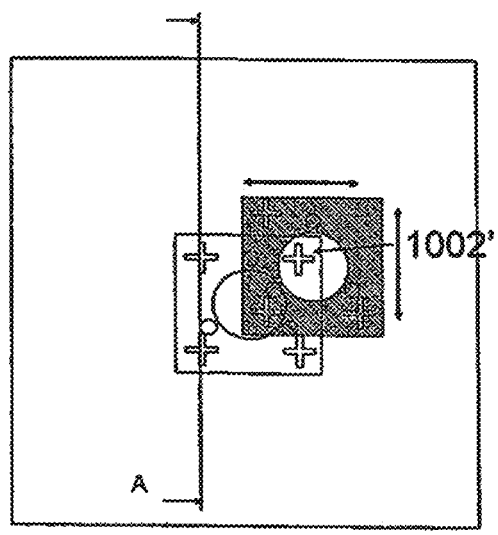
FIG. 7b shows a schematic sectional view according to cutting line A-A from FIG. 7a, FIG. 7c shows a schematic top view of the embodiment as claimed in the invention in the wedge error compensation step.
FIG. 7d shows a schematic sectional view according to cutting line A-A from FIG. 7c.
FIG. 7e shows a detailed view for the wedge error compensation step.
Figure 7B:
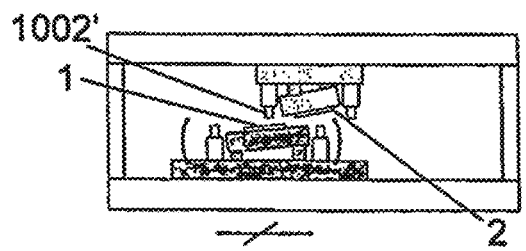
Figure 7C:
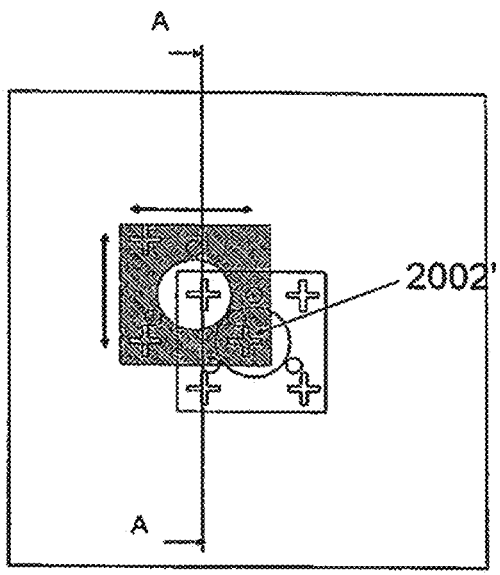
Figure 7D:
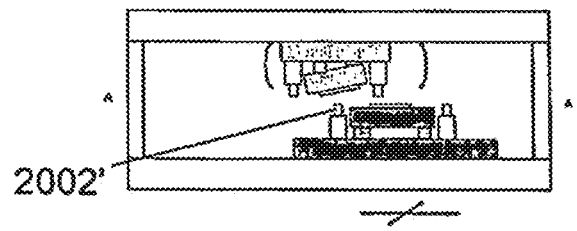
Figure 7E:
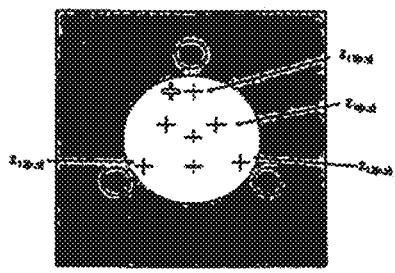
Figure 8A:
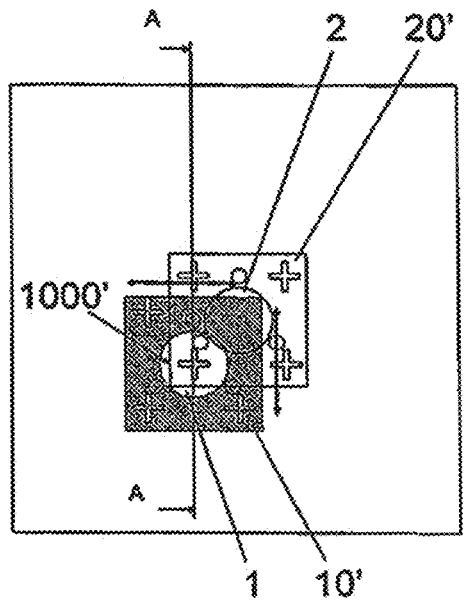
FIGS. 8a and 8b show a schematic top view of the alternative embodiment in alignment key detection.
Figure 8B:
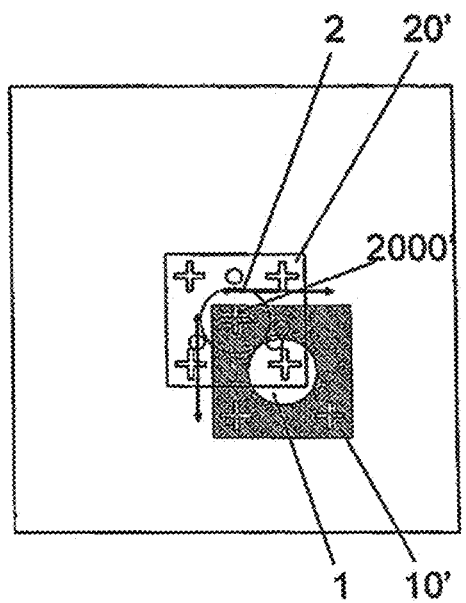
Figure 8C:
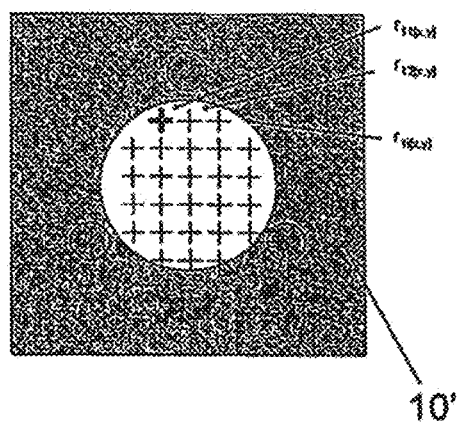
FIG. 8c shows a schematic detailed view of alignment key detection.
Figure 9A:
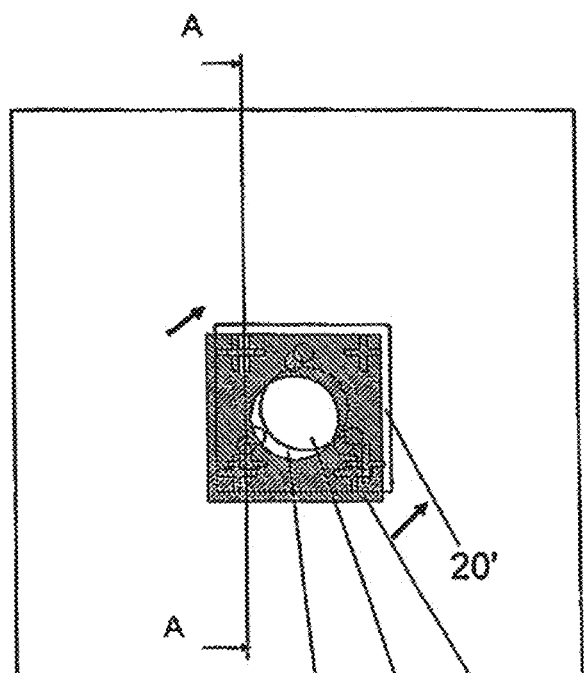
FIG. 9a shows a schematic of an alternative embodiment in the alignment of the substrates.
Figure 9B:
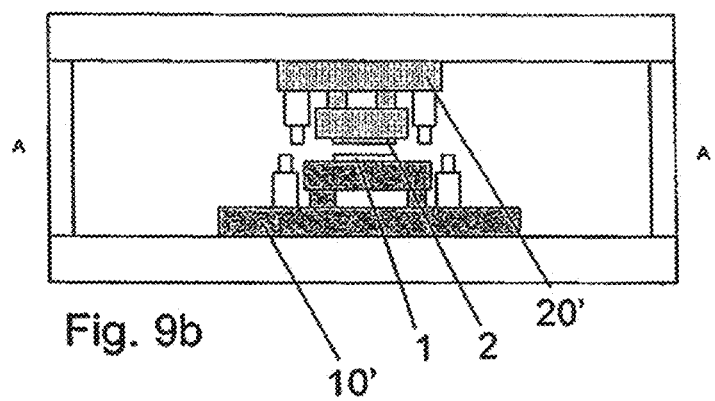
FIG. 9b shows a schematic sectional view according to cutting line A-A from FIG. 9a, FIG. 9c shows a schematic section of the alternative embodiment after contacting in the Z direction.
Figure 9C:
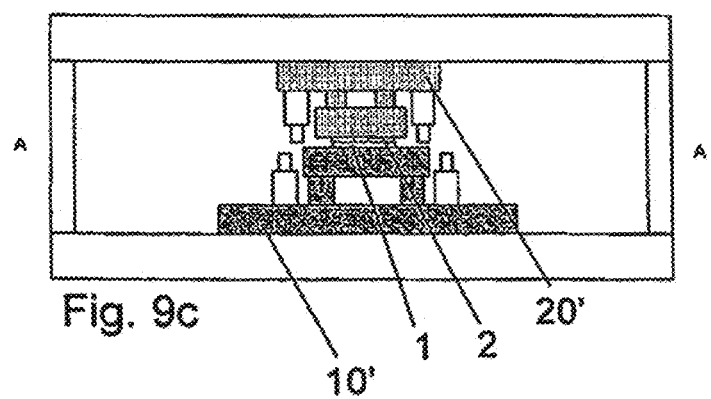

In the wedge error correction shown in FIGS. 7a to 7e, the first contact surface 1k is moved and measured at different positions as shown in FIG. 7e by moving the first platform 10' to the distance measurement means 1002' which is located fixed on the second platform 20'. Then the distance from the measurement points on the second contact surface 2k is measured by movement of the distance measurement means 2002' located on the first platform 10'.

Based on the measured distribution, the first contact surface 1k and the second contact surface 2k can be aligned parallel to one another by the corresponding movement of the actuators 11 and 21.

The parallel first and second X-Y planes 5, 6 have a minor distance, but are not in the same plane in this embodiment.

Then the first alignment keys 3.1 to 3.n of the first substrate 1 are detected by means of the alignment key detector 1000' which is attached to the second platform 20', specifically their absolute positions in the first X-Y coordinate system. From the detected coordinates a linear or nonlinear mathematical distribution model and/or corresponding model parameters are computed, as in the embodiment as shown in FIGS. 1a to 5b.

Then the second alignment keys 4.1 to 4.n of the second substrate 2 are detected by means of the alignment key detector 2000' which is fixed on the first platform 10' and their coordinates are detected in the second X-Y coordinate system. From the detected coordinates a linear or nonlinear mathematical distribution model and/or model parameters are computed or approached accordingly.

The alignment position of the first platform 10' can be computed to align the substrates 1 and 2 accordingly from the model parameters or the mathematical distribution model of the first and second alignment keys 3.1 to 3.n and 4.1 to 4.n and the positions known by the position detection means 31', 33' and 35', especially laser interferometers, and the relation of the first platform 10' to the second platform 20' and the known positions of the alignment key detectors 1000' and 2000' in the respective X-Y coordinate system.

After alignment, the substrate 1 is moved into contact with the substrate 2 by actuators 11 in the Z direction.

Figure 10A:
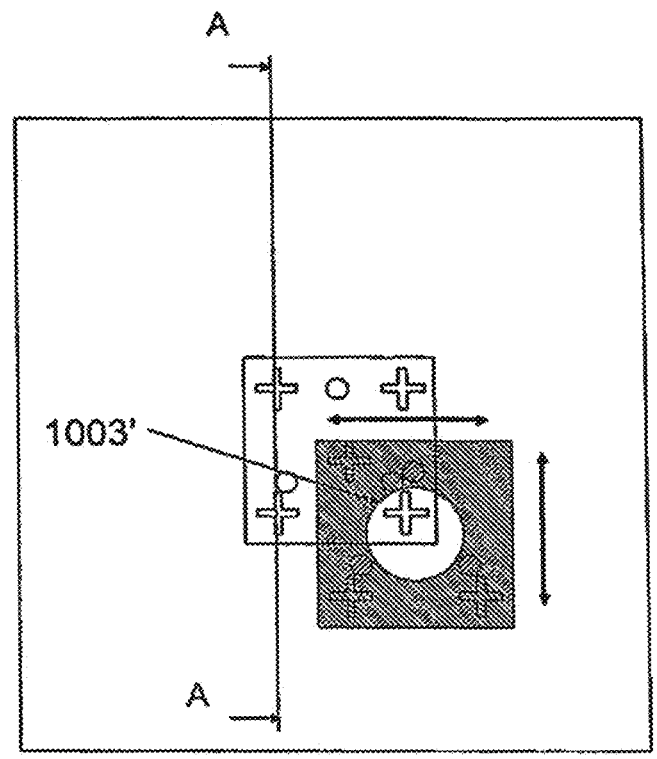
FIG. 10a shows a schematic top view of the alternative embodiment in the alignment checking step.
Figure 10B:
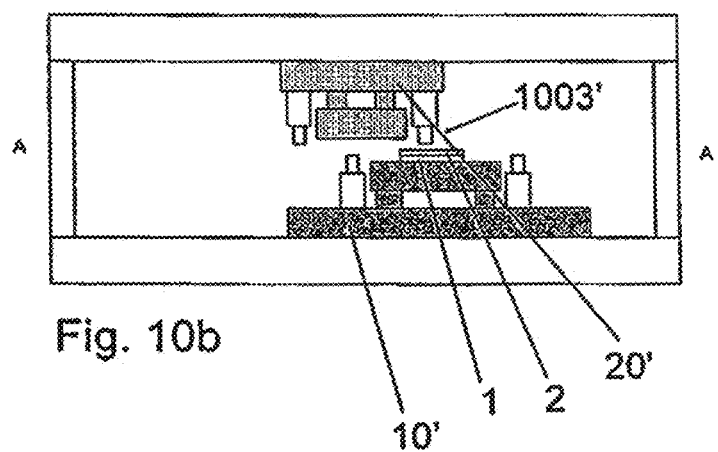

The quality of alignment and contacting of the substrate pair according to FIG. 10a and FIG. 10b is determined by the test detectors 1003' which are attached to the second platform 20'.

Much greater alignment accuracies are achieved by the above described embodiments, especially distributed over the contact surfaces 1k, 2k and with respect to the individual positions of the alignment keys, especially chips, so that an alignment accuracy of <250 nm, especially <150 nm, preferably <70 nm can be achieved.

DESCRIPTION OF THE REFERENCE NUMERALS 1 first substrate
1k first contact surface
2 second substrate
2k second contact surface
3.1 to 3.n first alignment key
4.1 to 4.n second alignment key
5 first X-Y plane
6 second X-Y plane
7, 7' first detection means
8, 8' second detection means
9, 9' base
10, 10' first platform
11 actuators
12 receiving means
20, 20' second platform
21 actuators
22 receiving means
30 position detection means
31, 31' position detection means
32 position detection means
33, 33' position detection means
34 position detection means
35, 35' position detection means
1000, 1000' alignment key detector
2000, 2000' alignment key detector
1001, 1001' optical detection means
2001, 2001' optical detection means
1002, 1002' distance measurement means
2002, 2002' distance measurement means
1003, 1003' test detectors Having described the invention, the following is claimed:

1. A device for alignment of a first contact surface of a first substrate with a second contact surface of a second substrate, said device comprising:
a first platform configured to hold the first substrate;
a second platform configured to hold the second substrate;
first detection means configured to detect first X-Y positions of first alignment keys located along the first contact surface of the first substrate in a first X-Y plane in a first X-Y coordinate system which is independent of motion of the first substrate, the first detection means comprising a single first alignment key detector;
second detection means fixed on a base of the first platform, the second detection means being configured to detect second X-Y positions of second alignment keys which correspond to the first alignment keys and which are located along the second contact surface of the second substrate in a second X-Y plane parallel to the first X-Y plane in a second X-Y coordinate system which is independent of motion of the second substrate; and
drive means configured to move at least one of the first platform and the second platform to align the first contact surface of the first substrate with the second contact surface of the second substrate, the drive means being further configured to align the first contact surface based on the first X-Y positions in a first alignment position and align the second contact surface based on the second X-Y positions in a second alignment position.

2. The device as claimed in claim 1, wherein the first detection means are further configured to detect the first X-Y positions of more than two of the first alignment keys, and wherein the drive means are further configured to align the first X-Y positions of the more than two of the first alignment keys with corresponding second alignment keys.

3. The device as claimed in claim 1, wherein the first and second X-Y plane in the detection of the first and second X-Y positions are at least quasi-identical to a contacting plane of the first contact surface of the first substrate and the second contact surface of the second substrate during contacting of the first contact surface of the first substrate and the second contact surface of the second substrate.

4. The device as claimed in claim 1, wherein the first and/or second X-Y coordinate systems are assigned to the base of the first platform.

5. The device as claimed in claim 1, wherein the first detection means is fixed on the base of the first platform.

6. The device as claimed in claim 1, further comprising:
test means configured to calibrate the device by checking the alignment of the first contact surface of the first substrate and the second contact surface of the second substrate when in contact with each other.

7. The device as claimed in claim 1, wherein the first and the second X-Y coordinate system are Cartesian coordinate systems and/or have identical scaling and/or coincide.

8. The device as claimed in claim 1, wherein the second detection means comprises a single second alignment key detector.

9. The device as claimed in claim 1, further comprising:
first and second measurement means and actuators for partially aligning the first and second contact surfaces by moving the first and second substrates transversely to the first and second X-Y planes.

10. A method for aligning a first contact surface of a first substrate with a second contact surface of a second substrate, the method comprising:
arranging the first contact surface of the first substrate in a first X-Y plane, the first substrate being held on a first platform;
arranging the second contact surface of the second substrate in a second X-Y plane which is parallel to the first X-Y plane, the second substrate being held by a second platform;
detecting, using a first detection means comprising a single first alignment key detector, first X-Y positions of first alignment keys located along the first contact surface of the first substrate in a first X-Y coordinate system which is independent of motion of the first substrate;
detecting, using a second detection means fixed on a base of the first platform, second X-Y positions of second alignment keys which correspond to the first alignment keys and which are located on the second contact surface of the second substrate in a second X-Y coordinate system independent of motion of the second substrate; and
aligning the first contact surface of the first substrate with the second contact surface of the second substrate, the alignment of the first contact surface of the first substrate being in a first alignment position and being determined based on the first X-Y positions and alignment of the second contact surface of the second substrate in a second alignment position lying opposite the first contact surface of the first substrate, the alignment of the second contact of the second substrate being determined based on the second X-Y positions.

\* \* \* \* \*